US009559081B1

(12) United States Patent
Lai et al.

(10) Patent No.: US 9,559,081 B1
(45) Date of Patent: Jan. 31, 2017

(54) INDEPENDENT 3D STACKING

(71) Applicant: Apple Inc., Cupertino, CA (US)

(72) Inventors: Kwan-Yu Lai, Cupertino, CA (US); Jun Zhai, Campbell, CA (US); Kunzhong Hu, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/935,310

(22) Filed: Nov. 6, 2015

Related U.S. Application Data

(60) Provisional application No. 62/208,544, filed on Aug. 21, 2015.

(51) Int. Cl.
| | |
|---|---|
| *H01L 25/065* | (2006.01) |
| *H01L 23/31* | (2006.01) |
| *H01L 23/48* | (2006.01) |
| *H01L 21/56* | (2006.01) |
| *H01L 21/683* | (2006.01) |
| *H01L 25/00* | (2006.01) |
| *H01L 23/00* | (2006.01) |
| *H01L 21/768* | (2006.01) |

(52) U.S. Cl.
CPC ......... *H01L 25/0657* (2013.01); *H01L 21/568* (2013.01); *H01L 21/6835* (2013.01); *H01L 21/7684* (2013.01); *H01L 23/3107* (2013.01); *H01L 23/481* (2013.01); *H01L 24/89* (2013.01); *H01L 25/50* (2013.01); *H01L 2221/68327* (2013.01); *H01L 2224/80895* (2013.01); *H01L 2224/80896* (2013.01); *H01L 2225/06541* (2013.01); *H01L 2225/06548* (2013.01)

(58) Field of Classification Search
CPC ...... H01L 25/0657; H01L 25/50; H01L 24/89; H01L 23/481; H01L 21/7684; H01L 21/6835; H01L 21/568; H01L 23/3107; H01L 2221/68327; H01L 2225/06541; H01L 2224/80896; H01L 2225/06548; H01L 2224/8089
See application file for complete search history.

(56) References Cited

U.S. PATENT DOCUMENTS

| | | |
|---|---|---|
| 8,518,746 B2 | 8/2013 | Pagaila et al. |
| 9,064,876 B2 | 6/2015 | Pagaila et al. |
| 2013/0235544 A1 | 9/2013 | Tucker et al. |
| 2014/0124949 A1 | 5/2014 | Paek et al. |
| 2014/0147970 A1 | 5/2014 | Kim et al. |

(Continued)

OTHER PUBLICATIONS

Kühne, et al., "Wafer-level packaging and direct interconnection technology based on hybrid bonding and through silicon vias" J. Micromech. Microeng. 21 (2011) 085032 (7pp), IOP Publishing, 2011, pp. 1-7.

(Continued)

*Primary Examiner* — Roy Potter
*Assistant Examiner* — Paul Patton
(74) *Attorney, Agent, or Firm* — Blakely, Sokoloff, Taylor & Zafman LLP

(57) ABSTRACT

Packages and 3D die stacking processes are described. In an embodiment, a package includes a second level die hybrid bonded to a first package level including a first level die encapsulated in an oxide layer, and a plurality of through oxide vias (TOVs) extending through the oxide layer. In an embodiment, the TOVs and the first level die have a height of about 20 microns or less.

19 Claims, 17 Drawing Sheets

(56) References Cited

U.S. PATENT DOCUMENTS

| | | |
|---|---|---|
| 2014/0256087 A1 | 9/2014 | Liu et al. |
| 2015/0021785 A1* | 1/2015 | Lin ...................... H01L 23/481 |
| | | 257/774 |
| 2015/0028498 A1 | 1/2015 | Ji et al. |
| 2015/0123268 A1 | 5/2015 | Yu et al. |
| 2015/0235949 A1* | 8/2015 | Yu ...................... H01L 23/3128 |
| | | 257/774 |

OTHER PUBLICATIONS

PCT International Search Report and Written Opinion for International Application No. PCT/US2016/037690, mailed Sep. 26, 2016, 11 pages.

* cited by examiner

INDEPENDENT 3D STACKING

CROSS-REFERENCE TO RELATED APPLICATIONS

This application claims the benefit of priority from U.S. Provisional Application No. 62/208,544, filed on Aug. 21, 2015, which is herein incorporated by reference.

BACKGROUND

Field

Embodiments described herein relate to semiconductor packaging. More particularly, embodiments relate to packages including 3D stacked die.

Background Information

The current market demand for portable and mobile electronic devices such as mobile phones, personal digital assistants (PDAs), digital cameras, portable players, gaming, and other mobile devices requires the integration of more performance and features into increasingly smaller spaces. Additionally, while the form factor (e.g. thickness) and footprint (e.g. area) for semiconductor die packaging is decreasing, the number of input/output (I/O) pads is increasing.

Various multiple-die packaging solutions such as system in package (SiP) and package on package (PoP) have become more popular to meet the demand for higher die/component density devices. In an SiP a number of different die are enclosed within the package as a single module. Thus, the SiP may perform all or most of the functions of an electronic system.

A 3D stacking implementation such as chip on wafer (CoW) includes mounting of die onto a support wafer, followed by singulation of stacked die SiPs. A 3D stacking implementation such as wafer to wafer (W2W) includes mounting of a top wafer onto a bottom wafer, followed by singulation of stacked die SiPs. Both of the conventional 3D stacking implementations require that one of the package level tiers (e.g. mounted die, or die within wafer) to be bigger or equal to the other tier. For example, CoW may involve the singulated area of the support wafer being bigger than the die mounted on the support wafer, while W2W may involve equal areas of the singulated wafers.

SUMMARY

Embodiments describe semiconductor die packages. In one embodiment, a package includes a first level redistribution layer (RDL), and a front side of a first package level on the RDL. The first package level includes one or more first level die encapsulated within a gap fill oxide layer on the RDL. A plurality of through oxide vias (TOVs) extend through the gap fill oxide layer. In an embodiment, the TOVs and the first level die have a height of about 20 microns or less. A second level die is included in a second package level, and the second level die is hybrid bonded to a back side of the first package level, with the hybrid bond including direct bonded oxide-oxide surfaces and direct bonded metal-metal surfaces. The second level die may be encapsulated in molding compound, for example, on the first package level. In an embodiment, the RDL is formed on and in electrical contact with a front side of the first level die and the plurality of TOVs.

In an embodiment, the first package level includes a first package level RDL on a back side of the first level die and the gap fill oxide layer. The second level die may be hybrid bonded to a planarized back surface of the first package level RDL. For example, the first package level RDL may include an oxide dielectric layer and metal redistribution line, and the second level die is hybrid bonded to the oxide dielectric layer and the metal redistribution line. The first level die may include a plurality of through silicon vias (TSVs), with the first package level RDL formed on an in electrical contact with the plurality of TSVs.

In accordance with some embodiments, the TOVs may be arranged in rows. For example, the plurality of TOVs may include a first row of TOVs and a second row of TOVs. In a particular arrangement, the first and second rows of TOVs are laterally adjacent to a first pair of laterally opposite sides of the first level die. A second-first level die and a third-first level die can be located laterally adjacent to a second pair of laterally opposite sides of the first level die. In such an arrangement, the RDL may be formed on an in electrical contact with a front side of the first level die, a front side of the second-first level die, a front side of the third-first level die, the first row of TOVs, and the second row of TOVs. The first level die may additionally include a plurality of TSVs, for example, with a maximum width of about 10 microns or less.

In an embodiment, a package includes an RDL, and a front side of a first package level on a back side of the RDL. A first level die is encapsulated in a gap fill oxide layer on the back side of the RDL. A first row of TOVs and a second row of TOVs protrude from the back side of the RDL, and the first level die is located laterally between the first and second rows of TOVs. A plurality of second level die are hybrid bonded to a back side of the first package level with direct bonded oxide-oxide surfaces and direct bonded metal-metal surfaces.

The first package level may additionally include a first package level RDL on a back side of the first level die and the gap fill oxide layer. For example, the first package level RDL may include an oxide dielectric layer and a metal redistribution line, and the second level die is hybrid bonded to the oxide dielectric layer and the metal redistribution line.

The first package level may additionally include a second-first level die and a third-first level die laterally adjacent to opposite sides of the first level die. The first level die, second-first level die, and third-first level die may all be on an in electrical contact with the RDL. In an embodiment, the first level die is rectangular, the first and second rows of TOVs are laterally adjacent to a first pair of laterally opposite sides of the first level die, and the second-first level die and the third-first level die are laterally adjacent to a second pair of laterally opposite sides of the first level die. In accordance with embodiments, the first level die, the first row of TOVs, and the second row of TOVs may all have a height of 20 microns or less. In accordance with embodiments, a plurality of TSVs may be within the first level die, with each TSV having a maximum width of 10 microns or less.

In an embodiment, a method of forming a package includes forming a first package level on a carrier substrate, the first package level including a first level die encapsulated in a gap fill oxide layer, and a plurality of though oxide vias (TOVs). The TOVs may have a height of about 20 microns or less. A second level die is hybrid bonded to the first package level with direct bonded oxide-oxide surfaces and metal-metal surfaces. The second level die is encapsulated on a back side of the first package level. The carrier substrate is removed, and a RDL is formed on a front side of the first package level.

In an embodiment, the method of forming the package additionally includes attaching the first level die to the carrier substrate, depositing the gap fill oxide layer over the first level die, planarizing the gap fill oxide layer, and forming the plurality of TOVs in the gap fill oxide layer. In an embodiment, the first level die is ground to reduce a thickness of the first level die after attaching the first level die to the carrier substrate and prior to depositing the gap fill oxide layer over the first level die. In an embodiment, a first level RDL is formed on the planarized gap fill oxide layer and first level die, and the first level RDL is planarized, and the second level die is hybrid bonded to the planarized first level RDL.

DETAILED DESCRIPTION

Figure 1:
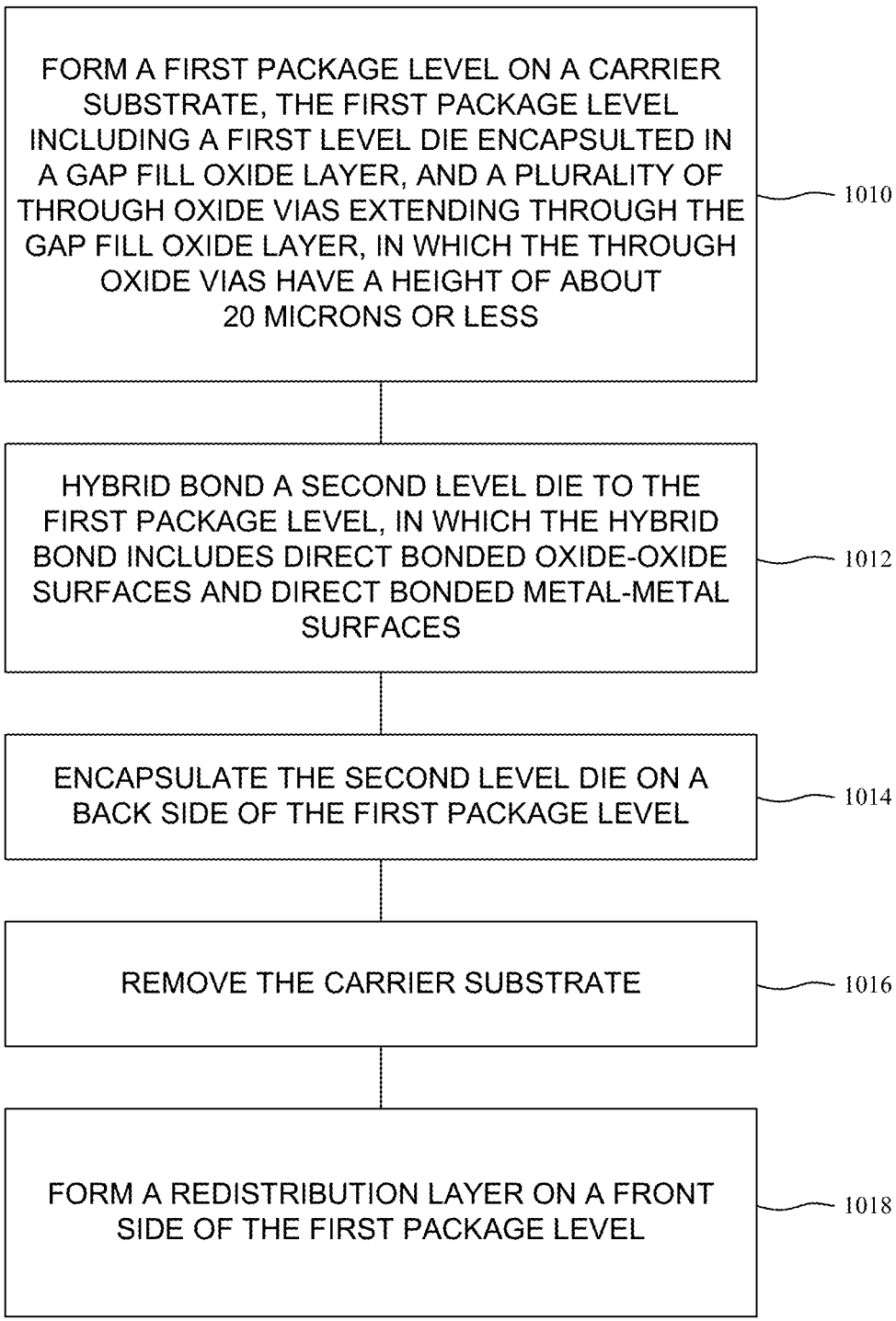
FIG. 1 is a flow chart illustrating a method of forming a package in accordance with an embodiment.

Embodiments describe semiconductor packages and packaging processes of heterogeneous stacked die. In accordance with embodiments, flexibility in heterogeneous die integration may be achieved independent of die area or thickness, in any package level. In this aspect, system on chip (SoC) die partitioning within an SiP structure may be possible in which intellectual property (IP) cores are freely segregated throughout the package.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "top", "bottom", "front", "back", "over", "to", "between", and "on" as used herein may refer to a relative position of one layer with respect to other layers. One layer "over", or "on" another layer or bonded "to" or in "contact" with another layer may be directly in contact with the other layer or may have one or more intervening layers. One layer "between" layers may be directly in contact with the layers or may have one or more intervening layers.

In one embodiment, a package includes a first package level including one or more first level die encapsulated within a gap fill oxide layer and a first level RDL spanning across the one or more first level die and the gap fill oxide layer. A planarized front surface of a second level die is hybrid bonded to a planarized surface of the first level RDL, which may include coplanar metal and oxide surfaces. In accordance with embodiments, the hybrid bonds include oxide-oxide bonds and metal-metal bonds between the second level die and the first level RDL. In this aspect, significant package z-height savings may be realized by eliminating interface materials for bonding. Furthermore, hybrid bonding may allow for a high connection density.

In accordance with embodiments, through silicon vias (TSVs) may optionally be formed through the one or more first level die and through oxide vias (TOVs) may be formed through the gap fill oxide layer encapsulating the one or more first level die within the first package level. In accordance with embodiments, a thickness of the first level die, gap fill oxide layer, and TOVs may be reduced to about 20 µm or less, such as 2 µm-20 µm, or 5 µm-10 µm. In this manner, not only is z-height savings realized, it is possible to form narrow TSVs and TOVs without height being a practical limiting factor to minimum width of the TSVs and TOVs. In this aspect, direct and short communication paths to the second level die within the second level package are possible, at virtually any place through the first package level. This may additionally allow for minimal routing penalties due to routing length lengths, and full access for die in any package level to power distribution. In accordance with embodiments, the combination of TSVs and/or TOVs, and hybrid bonding allows for significant flexibility in heterogeneous die integration.

In one aspect, embodiments describe system on chip (SoC) die partitioning and/or die splitting within an SiP structure (e.g. 3D memory package) in which IP cores such as CPU, GPU, IO, DRAM, SRAM, cache, ESD, power management, and integrated passives may be freely segregated throughout the package, while also mitigating total z-height of the package. Different IP cores can be segregated into different die within the package. Additionally, die partitioning may allow the integration of different process nodes into separate die. Likewise different IP cores in different die can be processed at different process nodes. By way of example, central processing unit (CPU) and general processing unit (GPU) can be separate die processed at different process nodes. Flexibility in die partitioning may be facilitated by the ability to access the power supply line anywhere. Flexibility in die partitioning may also mitigate thermal constraints across the system.

In an embodiment, the first level die is an active die that includes active IP cores that benefit from relieved routing densities and short routing paths, such as a central processing unit/general processing unit (CPU/GPU) die. In an embodiment, the package is a 3D memory package, such as a wide I/O DRAM package. In an embodiment, the one or more second level die are memory die, such as, but not limited to, DRAM. In an embodiment, the additional first level die, such as the second-first level die and the third-first level die are a partitioned IP core, such as, but not limited to, split I/O die.

In accordance with embodiments, a thickness or height of the first level die and TOVs is about 20 µm or less, such as 5 to 10 µm. In this manner, not only is z-height savings realized, it is possible to form narrow TOVs. In an embodiment, an exemplary TOV is about 10 µm wide, though narrower or wider TOVs may be formed, for example, easily within a 10:1 (height:diameter) aspect ratio. In an embodiment, an exemplary TOV is about 2 µm wide. In this aspect, the reduced thickness of the first level die allows for the formation of TOVs with substantially less width (or diameter) compared to common TSVs such as those in a traditional interposer.

In accordance with embodiments, TOVs and optionally TSVs may be used to provide short vertical communication paths between the package levels. In accordance with embodiments TOVs may also be arranged in rows to provide short routing paths from the second level die to edges (e.g. each edge) of a first level die (e.g. active die), which can also allow for high routing densities with mitigated routing jam. In an exemplary embodiment, the pitch between TOVs in a row of TOVs may have a gap ratio of TOV to oxide between TOVs of 1:1. By way of example, exemplary 10 µm wide TOVs have a pitch of 20 µm (in x and/or y dimensions). This may correspond to a density of 50×50 per mm² (or 2,500 per mm²). Embodiments are not limited to these exemplary gap ratios, TOV pitches, and TOV densities. For example, the amount of oxide between TOVs can be increased above the 1:1 gap ratio. Larger pitches, such as 40 µm-70 µm may also be implemented. Additionally, narrower TOVs may be fabricated. In another exemplary embodiment, TOVs are 2 µm wide. Assuming a 1:1 gap ratio, this may correspond to a pitch of 4 µm, and a density of 250×250 per mm² (or 62,500 per mm²).

In one aspect, embodiments describe an embedded TSV first level die configuration that may have a comparatively low keep out zone (KOZ). It has been observed that TSVs, such as copper TSVs through a silicon die, can create stress in the surrounding die area. As a result, active devices are arranged outside of a lateral KOZ around a TSV to mitigate TSV-induced stress on the active devices, such as affecting carrier mobility in the active devices. In accordance with embodiments, the reduced thickness of the embedded first level (e.g. active) die can allow the formation of TSVs with a substantially less width (or diameter) compared to common TSVs such as those in a traditional interposer. In some embodiments, aspect ratios of at most 10:1 first level die thickness:TSV maximum width are well within processing parameters. For example, TSVs having a maximum width (or diameter) of 2-10 µm, or less are possible. An exemplary list of TSV dimensions and aspect ratios is provided in Table 1 for illustrative purposes.

TABLE 1

TSV dimensions and aspect ratios

| First level die thickness (µm) | TSV width (µm) | TSV aspect ratio |
|---|---|---|
| 20 | 2 | 10:1 |
| 20 | 10 | 2:1 |
| 5 | 2 | 5:1 |

A reduced TSV height may allow for reduced TSV maximum width (or diameter), as well as increased TSV density and a smaller KOZ. In some embodiments, a TSV density of 250×250 per mm² (e.g. 62,500 per mm²) is possible, which may be greater than that achievable with traditional interposers at approximately 10×10 per mm² (or 100 per mm²). In some embodiments, a KOZ of less than approximately 5 µm is possible. In an embodiment, a TSV through the first level die is within 5 µm of an active device (e.g. transistor) in the first level die. In one aspect, this may allow for a greater degree of freedom in location of the active devices, as well as location and density of the TSVs to provide a shorter and more direct routing to the stacked second level die. In accordance with embodiments the stacked second level die can have relatively straight routing to the bottom landing pad or conductive bump of the package, where the power plane is, for example on a circuit board.

Referring now FIG. 1 a flow chart is provided illustrating a method of forming a package in accordance with an embodiment. In interest of clarity, the following description of FIG. 1 is made with regard to reference features found in other figures described herein. At operation a 1010 a first package level 150 is formed on a carrier substrate 101, 103. The first package level 150 may include a first level die 110 encapsulated in a gap fill oxide layer 130, and a plurality of though oxide vias (TOVs) 134. In an embodiment the TOVs 134 have a height of about 20 µm or less. A second level die 210 is then hybrid bonded to the first package level 150 at operation 1012 to form direct bonded oxide-oxide surfaces (e.g. for layers 164, 264) and metal-metal surfaces (e.g. for layers 162, 262), (see FIG. 9). At operation 1014 the second level die 210 is encapsulated on a back side 165 of the first package level 150, followed by removal of the carrier substrate 101, 103 at operation 1016. An RDL 300 may then be formed on a front side 170 of the first package level 150 at operation 1018.

Figure 2:
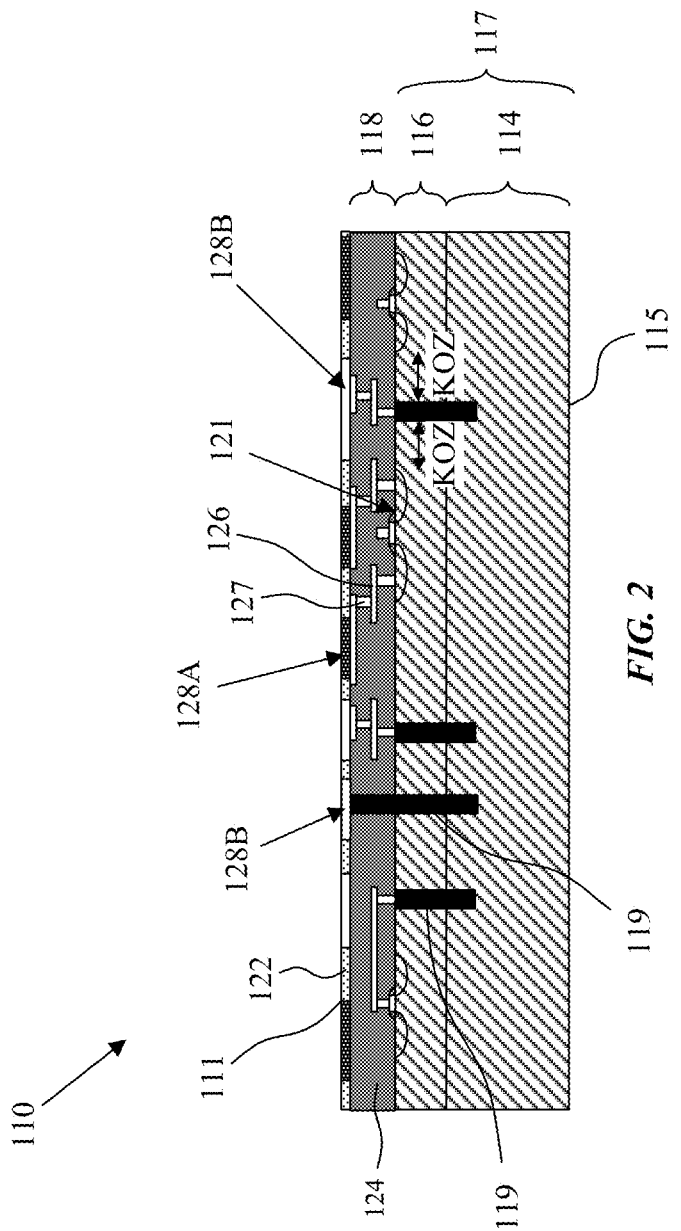
FIG. 2 is a schematic cross-sectional side view illustration of a first level die including blind vias in accordance with an embodiment.

In accordance with embodiments, the one or more first level die 110 may be active die, though this is not required. In other embodiments, the first level die 110 may be replaced with silicon interposers, or silicon integrated passive devices (IPDs). Referring now to FIG. 2 a schematic cross-sectional side view is provided of a first level die 110 including blind vias 119 in accordance with an embodiment. In accordance with embodiments, the first level die 110 may be an active die such as a logic die or SOC die including an active component(s) such as, but not limited to, a microprocessor, memory, RF transceiver, and mixed-signal component. In the particular embodiment illustrated, an active device 121 (e.g. transistor) of an active component is shown by way of example. As shown, the active devices 121 may be formed on a substrate 117 such as a silicon substrate or silicon on insulator (SOI) substrate. In an embodiment, the active devices 121 are formed in a top epitaxial silicon layer 116, formed over a base silicon substrate 114. In an embodiment, the KOZ is less than 5 μm, and a blind via 119 is formed within 5 μm (laterally) of an active device 121. One or more interconnect layers 118 may be formed for routing purposes to connect the active devices 121 and blind vias 119 to landing pads 128 (including both 128A, 128B on the front side 111) of the first level die 110. The interconnect layers 118 may include one or more metal layers 126 and/or dielectric layers 124. In the embodiment illustrated, the blind vias 119 (which will become TSVs 120) are interspersed between the active devices 121 in the first level die 110.

The metal layer(s) 126 may provide lateral interconnect paths, with vias 127 providing vertical connections. In accordance with embodiments, the front side 111 of the first level die 110 may include insulating layer 122 (e.g. oxide, or polymer) landing pads 128B connected to blind vias 119, and/or landing pads 128A connected to the active devices 121 of the first level die 110. In the embodiment illustrated, the blind vias 119 are formed in the active layer (e.g. top epitaxial layer 116) of the active devices 121. The blind vias 119 may extend completely through the active layer (e.g. epitaxial layer 116) and optionally into the base substrate 114. The depth of the blind vias 119 may be at least the depth of the final TSVs 120 to be formed. In an embodiment, the blind vias 119 may optionally extend at least partially through the interconnect layer(s) 118. For example, blind vias 119 may extend through the interconnect layer 118 to landing pads 128A, or to a metal layer 126 in an embodiment. In an embodiment, blind vias 119 may not contact a landing pad (e.g. 128A, 128B) on the front side 111 and instead connect with an active device 121 through one or more metal layers 126 and vias 127 in the interconnect layer 118. In this manner, the TSVs 120 to be formed can connect directly to the active devices 121 within the first level die 110.

Figure 3:
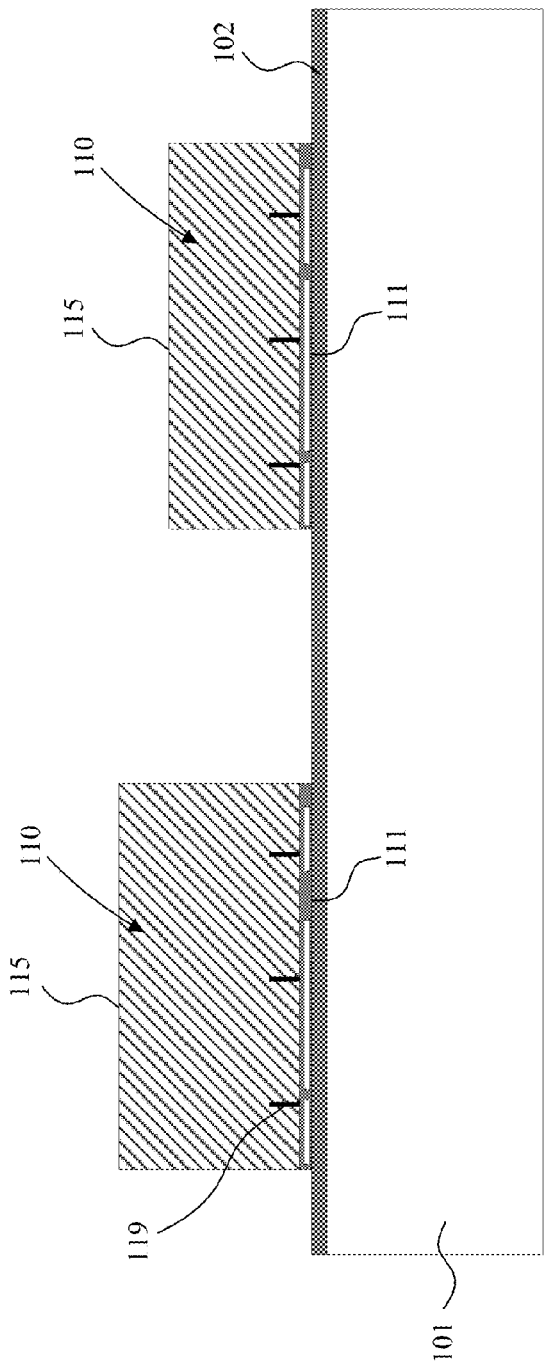
FIG. 3 is a cross-sectional side view illustration of first level die attached to a carrier substrate in accordance with an embodiment.

Referring now to FIG. 3, one or more first level die 110 are mounted on a carrier substrate 101 such as a glass panel, silicon wafer, metal panel, etc. The carrier substrate 101 may include a release layer 102 for mounting the first level die. In an embodiment, the release layer 102 is an oxide layer and the first level die 110 are mounted on the carrier substrate 101 with oxide-oxide bonds (e.g. bonding with oxide insulating layer 122). In an embodiment, the release layer 102 is an adhesive (e.g. polymer) or tape layer for mounting the first level die 110. As shown, the first level die 110 are mounted onto the carrier substrate 101 face down, such that the front sides 111 including the insulating layer 122 and landing pads 128 (128A, 128B) is face down. As shown, the one or more first level 110 may be different die, including different components, with different thicknesses and areas. One or more of the first level die 110 may be active die. Blind vias 119 are optionally formed within one or more of the first level die 110, though this is not required.

Figure 4:
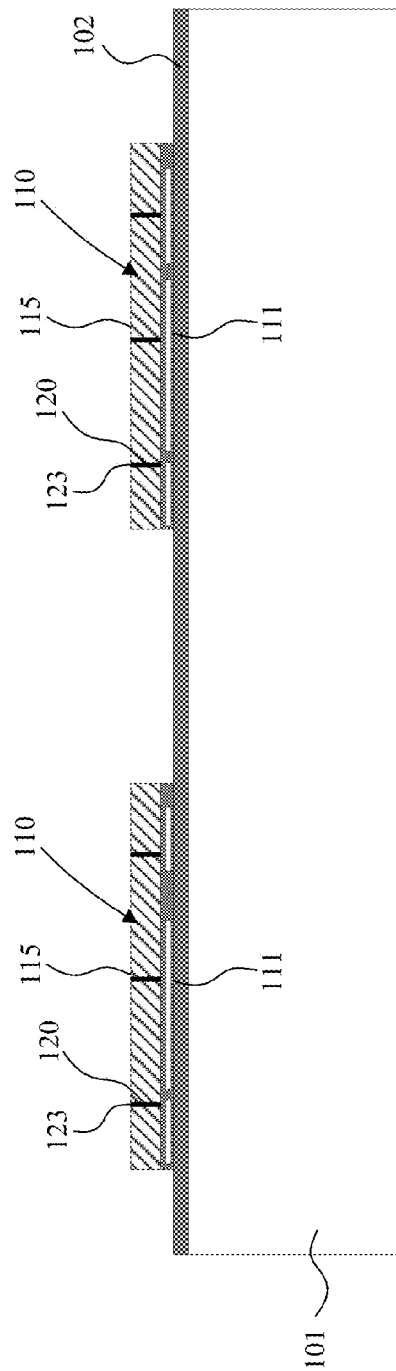
FIG. 4 is a cross-sectional side view illustration of thinned first level die in accordance with an embodiment.

The one or more first level die 110 may then be ground using a suitable technique such as chemical mechanical polishing (CMP) to reduce a thickness of the first level die 110, as shown in FIG. 4. In accordance with embodiments, the thinning of the first level die 110 may expose the blind vias 119, resulting in a back side 115 of the first level die 110 including exposed surfaces 123 of TSVs 120. In an embodiment, the first level die 110 are thinned to about 20 μm or less, such as 2 μm-20 μm, or 5 μm-10 μm.

Figure 5:
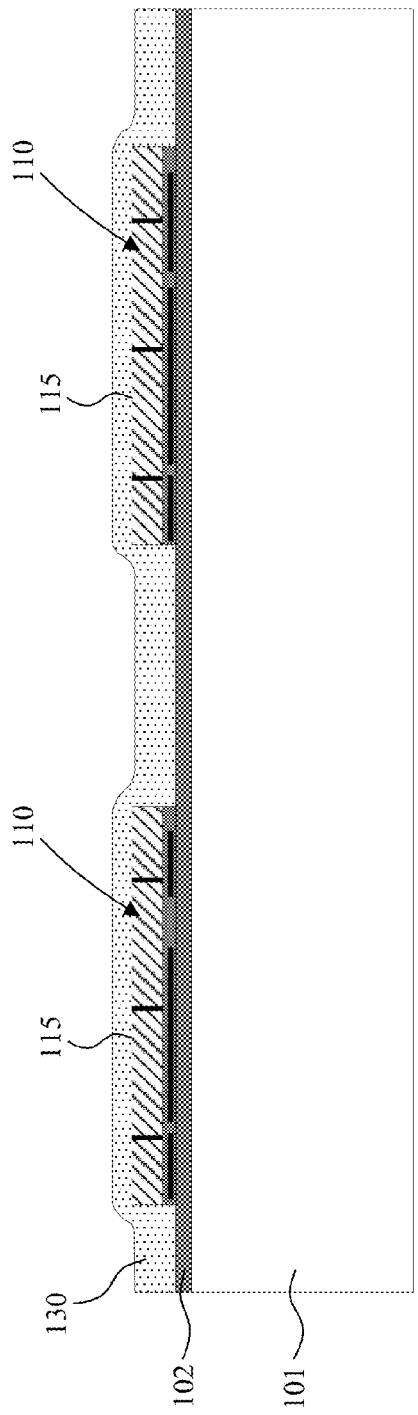
FIG. 5 is a cross-sectional side view illustration of a gap fill oxide layer formed over thinned first level die in accordance with an embodiment.

Referring to the embodiment illustrated in FIG. 5, a gap fill oxide layer 130 may then be formed over the thinned first level die 110. In an embodiment, gap fill oxide layer 130 is deposited using a suitable technique such as chemical vapor deposition (CVD), though other techniques may be used. Due to the reduced thickness of the first level die 110, a quality gap fill oxide layer 130 can be deposited using CVD, which may aid in hybrid bonding.

Figure 6:
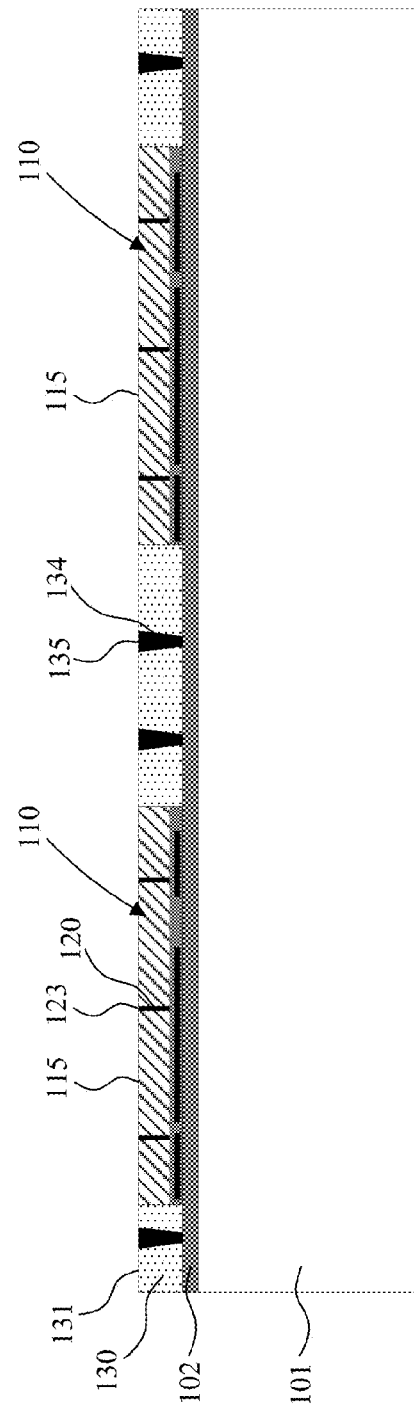
FIG. 6 is a cross-sectional side view illustration of a planarized gap fill oxide layer including through oxide vias in accordance with an embodiment.

Referring now to FIG. 6, TOVs 134 may be formed through the gap fill oxide layer 130. For example, the gap fill oxide layer 130 may be planarized, patterned, and TOVs 134 formed within the planarized gap fill oxide layer 130. TSVs 120 may also be optionally formed. For example, TSVs 120 may be formed at this stage in embodiments in which blind vias 119 were not previously formed in the first level die 110. In an embodiment, the thinned first level die 110 do not include TSVs 120. In the particular embodiment illustrated in FIG. 6, the back surface 131 of the gap fill oxide layer 130 and back side 115 of the first level die 110 are planarized, exposing surfaces 135 of the TOVs 134, and optionally surfaces 123 of the TSVs 120.

Figure 7:
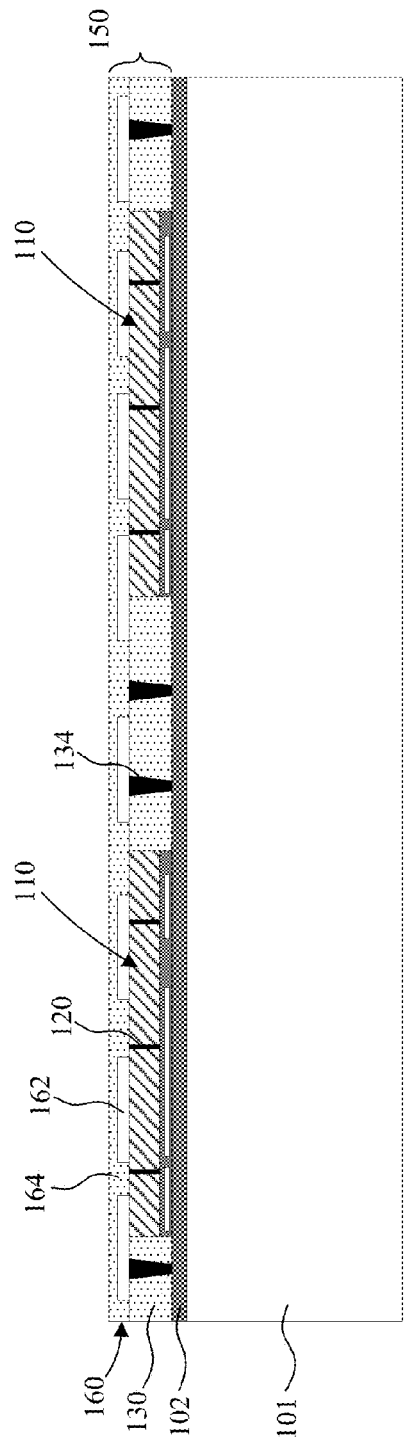
FIG. 7 is a cross-sectional side view illustration of a first level redistribution layer formed over a planarized gap fill oxide layer including through oxide vias in accordance with an embodiment.
Figure 8:
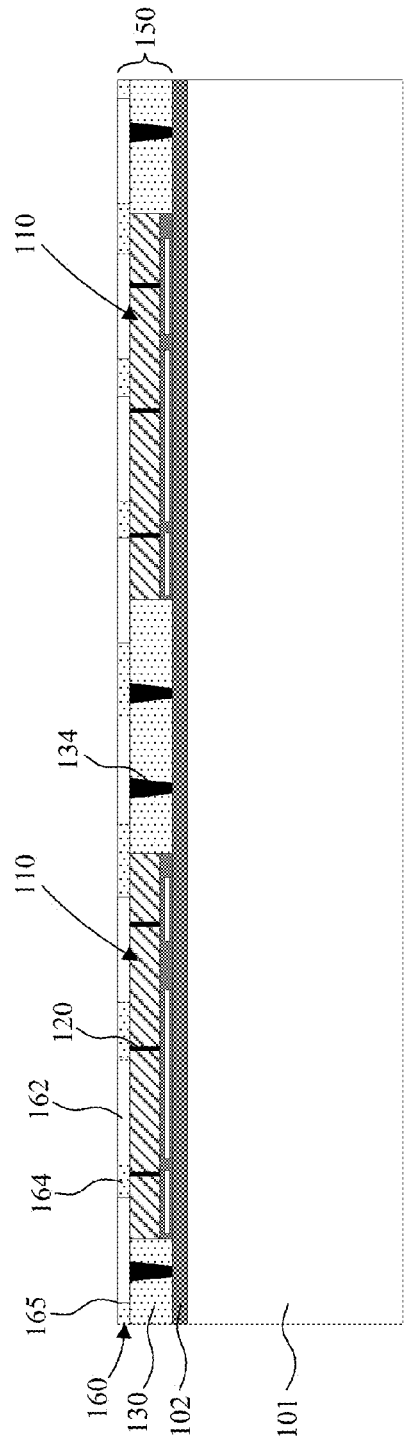
FIG. 8 is a cross-sectional side view illustration of a first package level including a planarized first level redistribution layer in accordance with an embodiment.

A first level RDL 160 may be optionally formed over the gap fill oxide layer 130 and thinned first level die 110 as illustrated in FIG. 7. The first level RDL may be formed on an in electrical contact with the plurality of TOVs 134 and/or TSVs 120. As shown, the first level RDL 160 may include one or more metal redistribution lines 162 (e.g. copper) and insulating layers 164. In an embodiment, one or more insulating layers 164 are formed of an oxide (e.g. $SiO_2$) for subsequent hybrid bonding. Together, the gap fill oxide layer 130, TOVs 134, first level die 110, and optional first level RDL 160 form the first package level 150. As illustrated in FIG. 8, a back side 165 of the first package level 150 (e.g. the first level RDL 160) may be planarized using a suitable technique such as CMP to form a planar surface for hybrid bonding.

Figure 9:
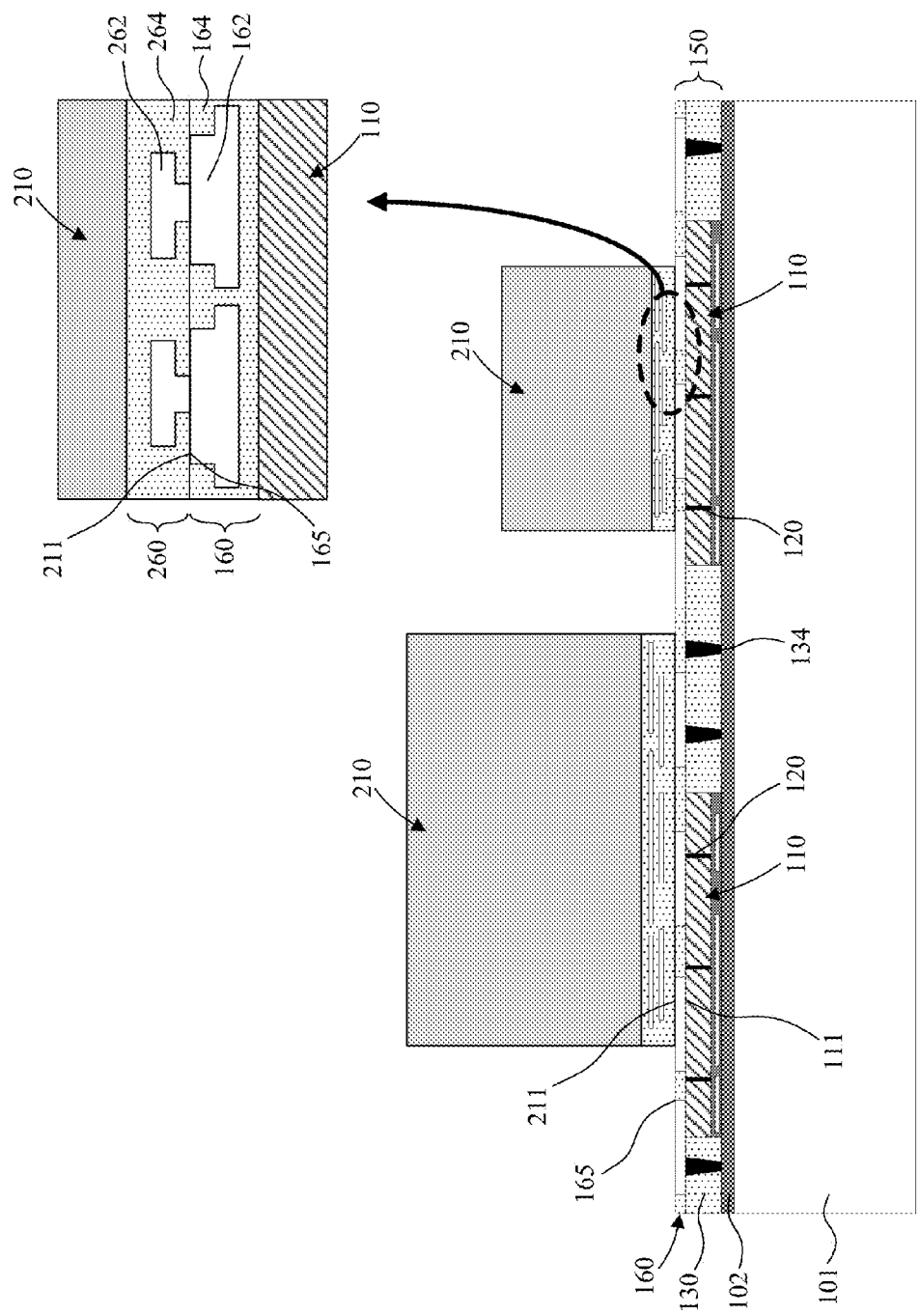
FIG. 9 is a cross-sectional side view illustration including a close-up view of second level die hybrid bonded to a first package level in accordance with an embodiment.
Figure 10:
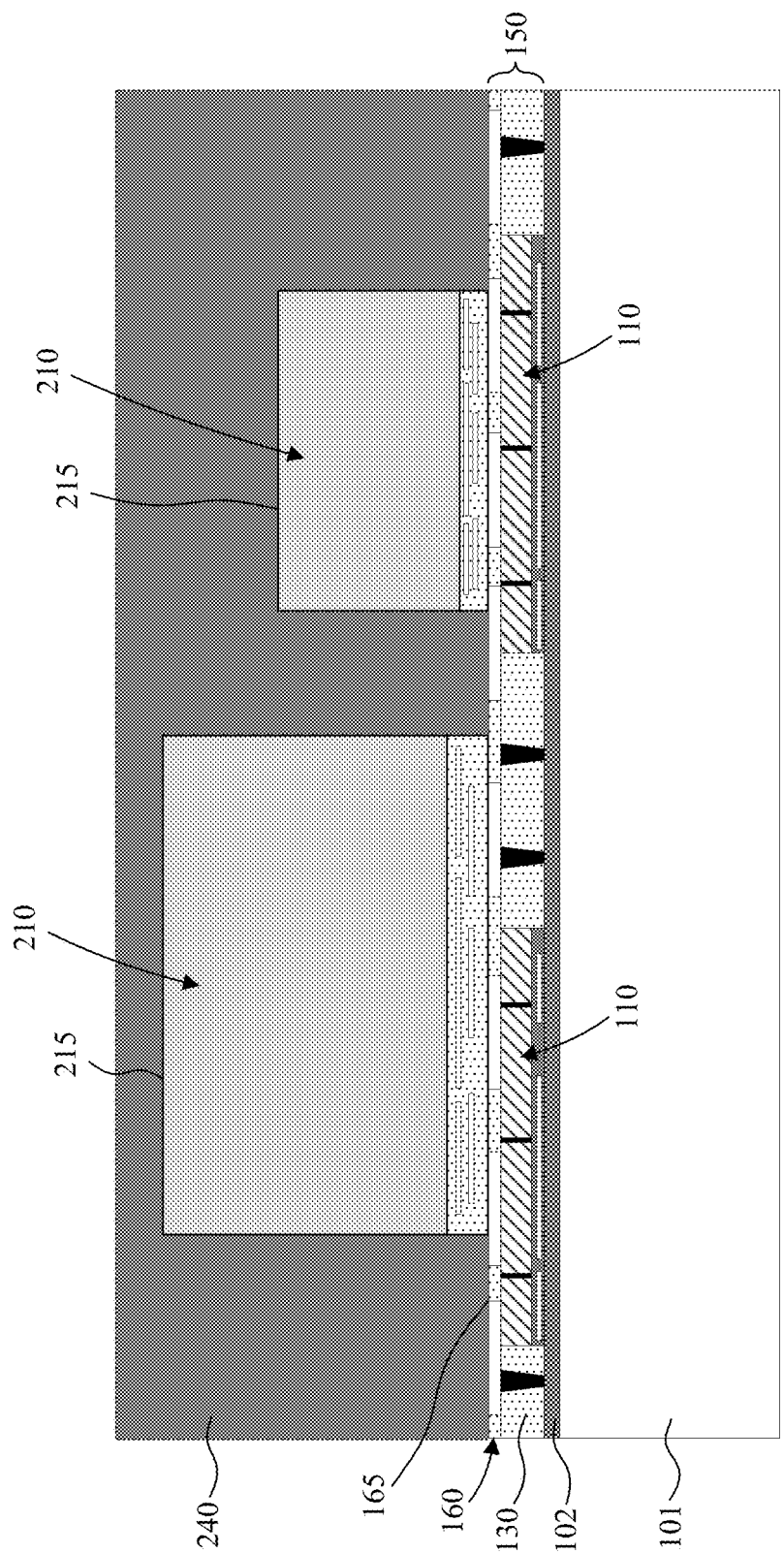
FIG. 10 is a cross-sectional side view illustration of encapsulated second level die on a first package level in accordance with an embodiment.

One or more second level die 210 may then be hybrid bonded to the first package level 150 as shown in the embodiment illustrated in FIG. 9. In the particular embodiment illustrated, the second level die 210 are hybrid bonded face down, with the (e.g. planar) front sides 211 of the second level die 210 hybrid bonded to the back side 165 (e.g. planar back surface) of the first package level 150. More specifically, the front surfaces 211 may be hybrid bonded to the first level RDL 160, when present. The close-up view of the hybrid bond in FIG. 9 shows direct bonded oxide-oxide surfaces of an insulating layer 164 (e.g. $SiO_2$) of the first level RDL 160 with an insulating layer 264 (e.g. SiO$_2$) of a build-up structure 260 for the second level die 210, and direct bonded metal-metal surfaces of redistribution line 162 (e.g. copper) of the first level RDL 160 with a metal layer 262 (e.g. copper) of the build-up structure 260 for the second level die 210.

The second level die 210 are then encapsulated in a second level molding compound 240 on the back side 165 of the first package level 150. For example, the second level molding compound 240 may include a thermosetting cross-linked resin (e.g. epoxy), though other materials may be used as known in electronic packaging. Encapsulation may be accomplished using a suitable technique such as, but not limited to, transfer molding, compression molding, and lamination. In the embodiment illustrated, the second level molding compound 240 covers the back sides 215 of the second level die 210. A thicker second level molding compound 240 may provide structural support during subsequent processing.

Figure 11:
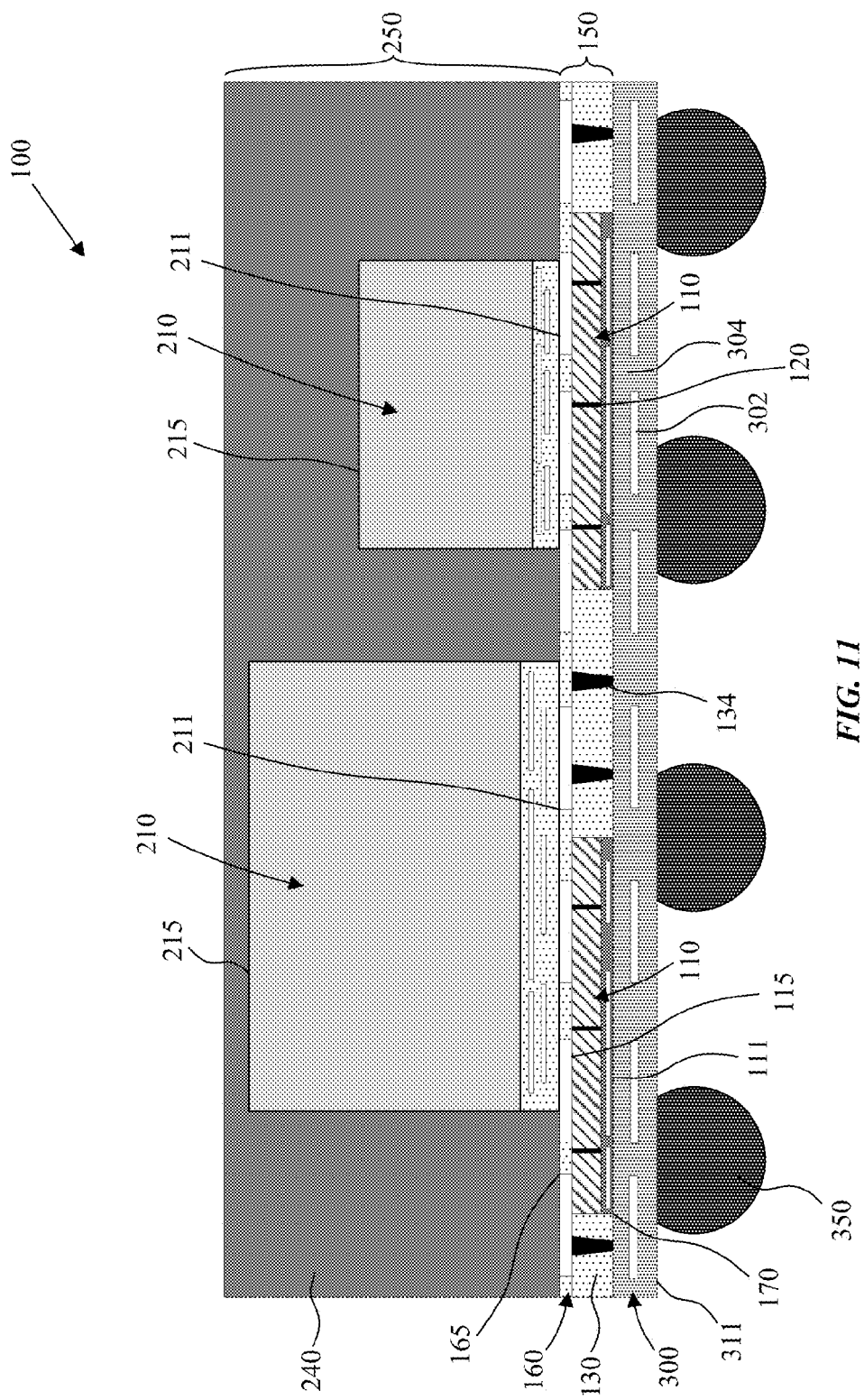
FIG. 11 is a cross-sectional side view illustration of package including hybrid bonded second level die in accordance with an embodiment.
Figure 12:
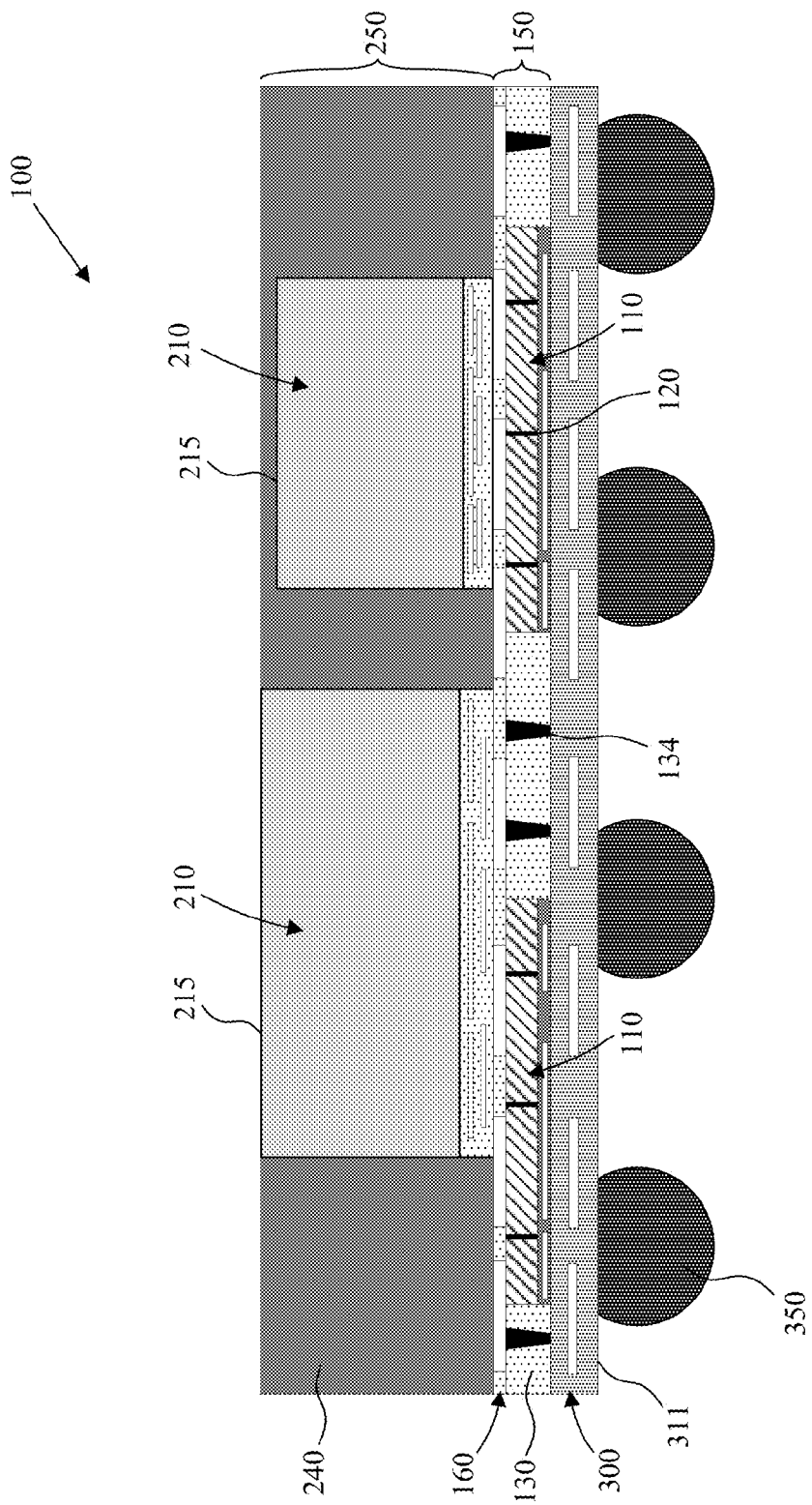
FIG. 12 is a cross-sectional side view illustration of package including a thinned second package level in accordance with an embodiment.

Referring now to FIG. 11, the carrier substrate 101 is removed, and an RDL 300 may be formed on the front side 170 of the first package level 150. Specifically, RDL 300 may be formed on the gap fill oxide layer 130 and front sides 111 of the first level die 110. As shown, RDL 300 may also be formed on and in electrical contact with the plurality of TOVs 134. RDL 300 may include a single redistribution line 302 or multiple redistribution lines 302 and dielectric layers 304. RDL 300 may be formed by a layer-by-layer process, and may be formed using thin film technology. In an embodiment, the RDL 300 has a total thickness of less than 50 μm, or more specifically less than 30 μm, such as approximately 20 μm. In an embodiment, RDL 300 includes embedded redistribution lines 302 (embedded traces). For example, the redistribution lines 302 may be created by first forming a seed layer, followed by forming a metal (e.g. copper) pattern. Alternatively, redistribution lines 302 may be formed by deposition (e.g. sputtering) and etching. The material of redistribution lines 302 can include, but is not limited to, a metallic material such as copper, titanium, nickel, gold, and combinations or alloys thereof. The metal pattern of the redistribution lines 302 is then embedded in a dielectric layer 304, which is optionally patterned. The dielectric layer(s) 304 may be any suitable material such as an oxide, or polymer (e.g. polyimide). Following formation of RDL 300 a plurality of conductive bumps 350 (e.g. solder bumps, or stud bumps) may be formed on a front side 311 of the RDL 300. Individual packages 100 may then be singulated from the reconstituted substrate. In some embodiments, a thickness of the second package level 250 including the second level molding compound 240 and second level die 210 may be reduced using a suitable technique such as CMP prior to singulation. In the embodiment illustrated in FIG. 12, the thickness of the second package level 250 may be reduced to expose the back side 215 of one or more second level die 210.

Figure 13:
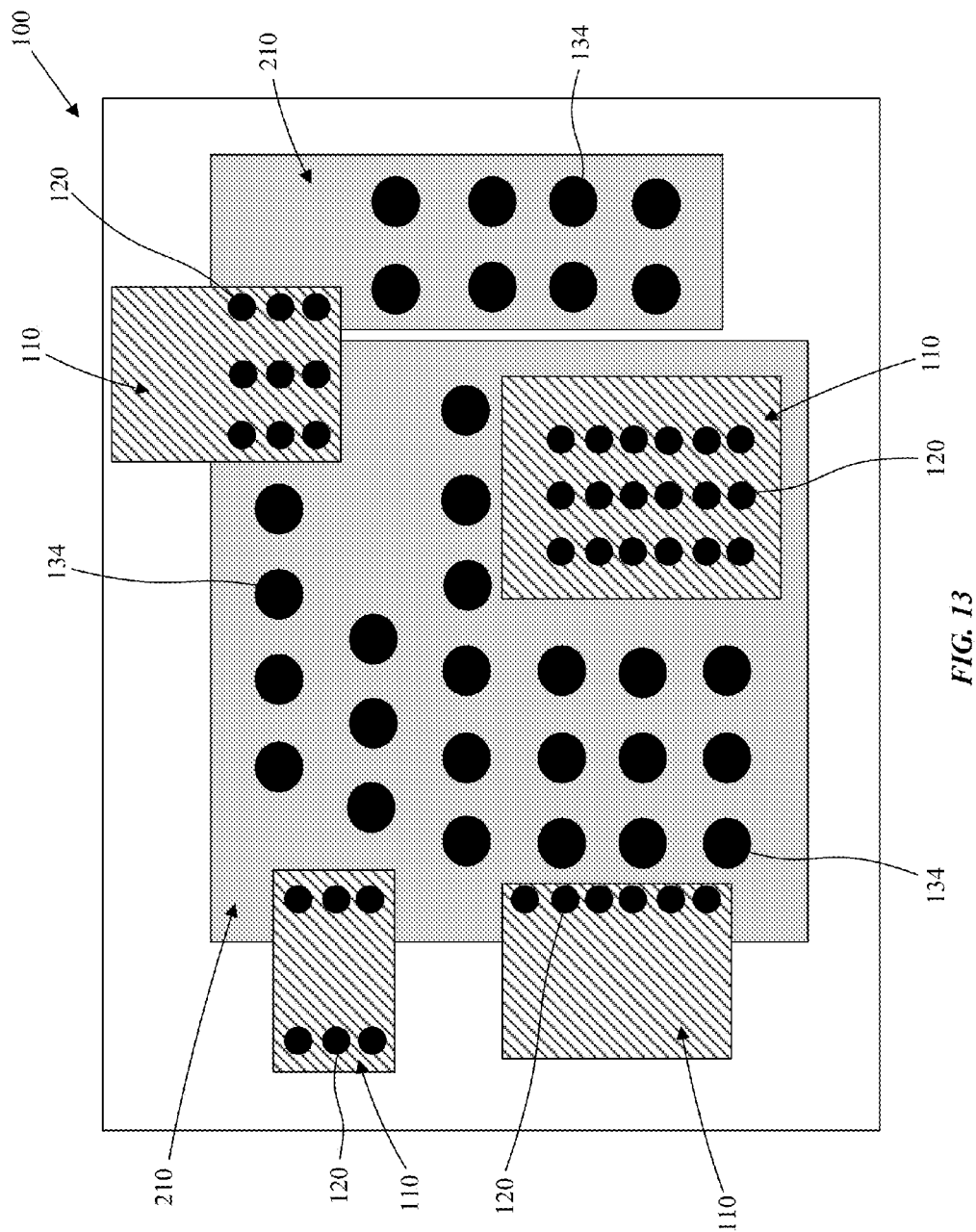
FIG. 13 is a schematic bottom view illustration of a package including stacked die, through oxide vias, and through silicon vias in accordance with an embodiment.

FIG. 13 is a schematic bottom view illustration of a package 100 in accordance with embodiments illustrating a variety of TOV 134 and optionally TSV 120 connections from the first package level 150 including the first level die 110 to the second package level 250 including the second level die 210. FIG. 13 also illustrates freedom of die size (x, y dimensions) and location (x, y placement) within package levels that may be possible with embodiments. In accordance with embodiments, heterogeneous die may be integrated into multiple package levels without one package level having to be larger than another package level. Thus, specific die need not be packaged into a primary carrier package level. Furthermore, short communication paths between package levels are achievable. In accordance with embodiments, vias (TOV or TSV) may be located at any location in the entire face of the first package level 150, which may allow for full access to power distribution for both the first level die 110 and second level die 210. In accordance with embodiments, short communication path lengths between first level die 110 and second level die 210 can additionally be provided where the die overlap. In one embodiment, a first level die 110 may be a bridging die, which includes TSVs 120 directly underneath and in communication with two separate second level die 210.

Figure 14:
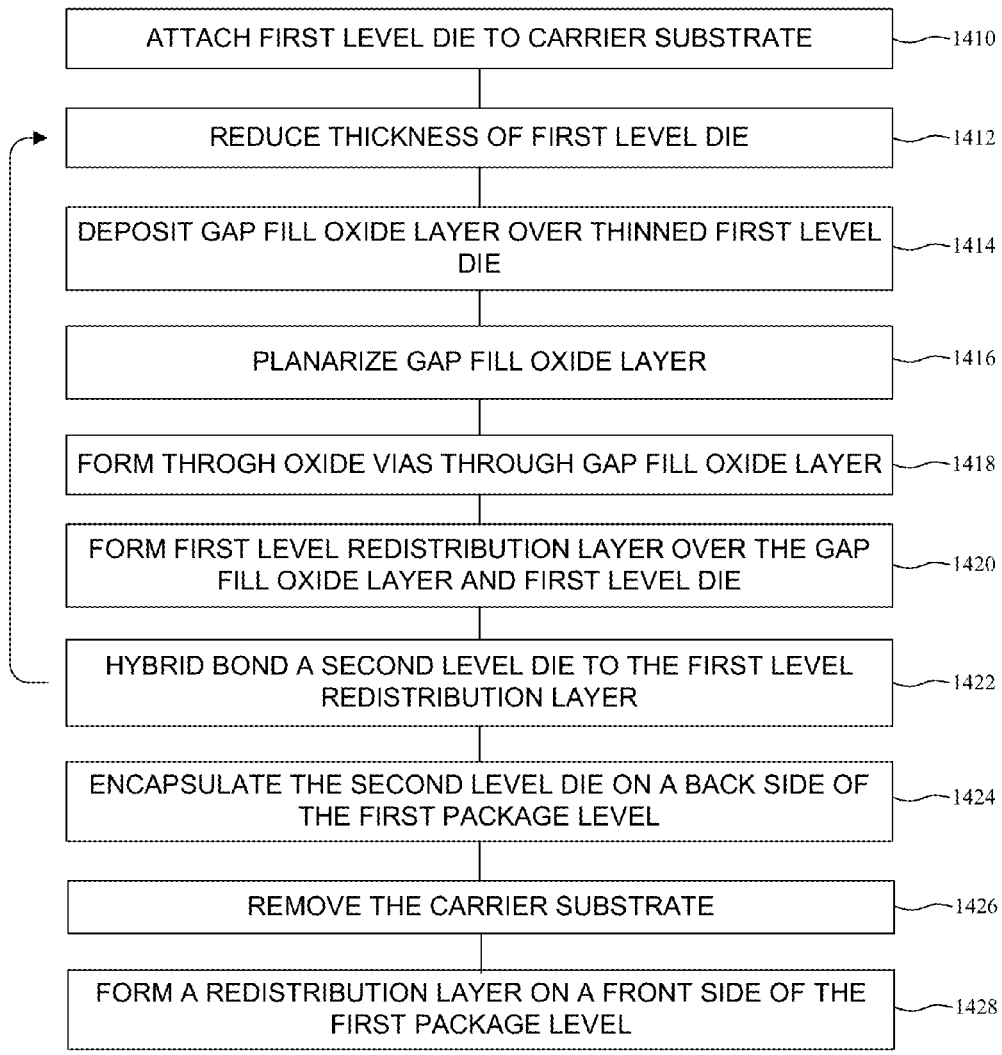
FIG. 14 is a flow chart illustrating a method of forming a package in accordance with an embodiment.

FIG. 14 is a flow chart illustrating a method of forming a package in accordance with an embodiment, which may optionally include forming more than two package levels. In the following description of FIG. 14 reference is made with regard to the features found in the cross-sectional side view illustrations provided in FIGS. 3-12 and FIGS. 15A-15D. Referring to FIG. 14, at operation 1410 a first level die 110 is attached to a carrier substrate 101, similarly as previously described with regard to FIG. 3A. At operation 1412 a thickness of the first level die 110 is reduced, similarly as described with regard to FIG. 4. At operation 1414, a gap fill oxide layer 130 is deposited over the thinned first level die 110, similarly as described with regard to FIG. 5. At operation 1416, the gap fill oxide layer 130 (and optionally the first level die 110) is planarized, similarly as described with regard to FIG. 6. At operation 1418, TOVs 134 are formed through the gap fill oxide layer 130, similarly as described with regard to FIG. 6. At operation 1420, a first level RDL 160 is formed over the gap fill oxide layer 130 and the first level die 110, similarly as described with regard to FIGS. 7-8, resulting in the structure illustrated in FIG. 15B.

Figure 15:
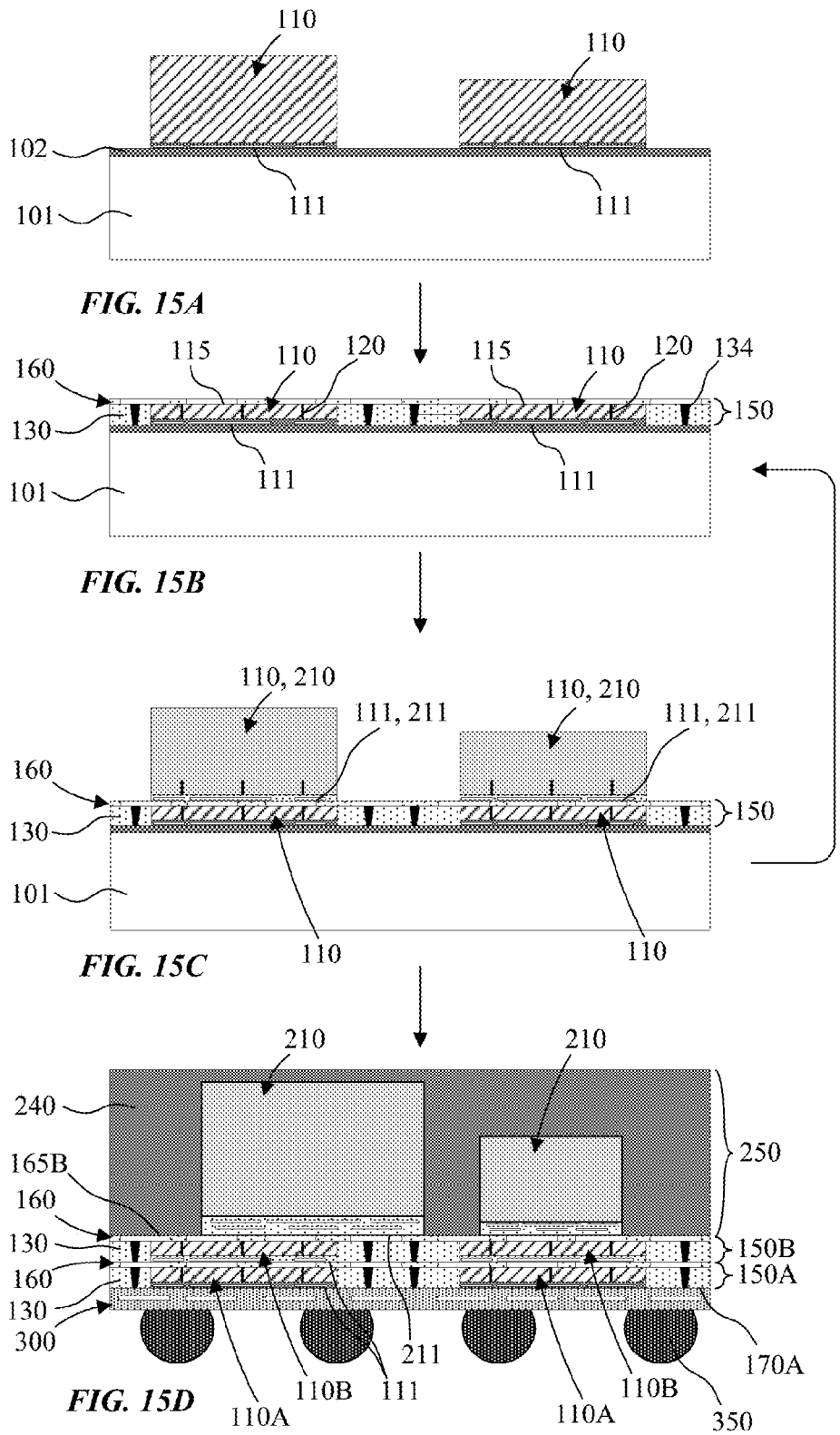
FIGS. 15A-15D are cross-sectional side view illustrations of a method of forming a package with more than two package levels in accordance with an embodiment.

At operation 1422, a second level die 210, or optionally first level die 110, is hybrid bonded to the first level RDL 160, similarly as described with regard to FIG. 9, resulting in the structure illustrated in FIG. 15C. At this stage, operations 1412-1422 may be repeated one or more times to form additional package levels 150A, 150B, etc. At operation 1424, the second level die 210 is encapsulated on a back side of the first package level, similarly as described with regard to FIG. 10. At operation 1426, the carrier substrate 101 is removed, and at operation 1428 an RDL is formed on a front side of the first package level, similarly as described with regard to FIG. 11. A thickness of the second package level 250 may then be reduced similarly as described with regard to FIG. 12. Referring to FIG. 15D a process flow is illustrated in which two package levels 150A, 150B are formed, the second level die 210 is encapsulated on a back side 165B of the first package level 150B, and the RDL 300 is formed on the front side 170A of the first package level 150A.

Figure 16:
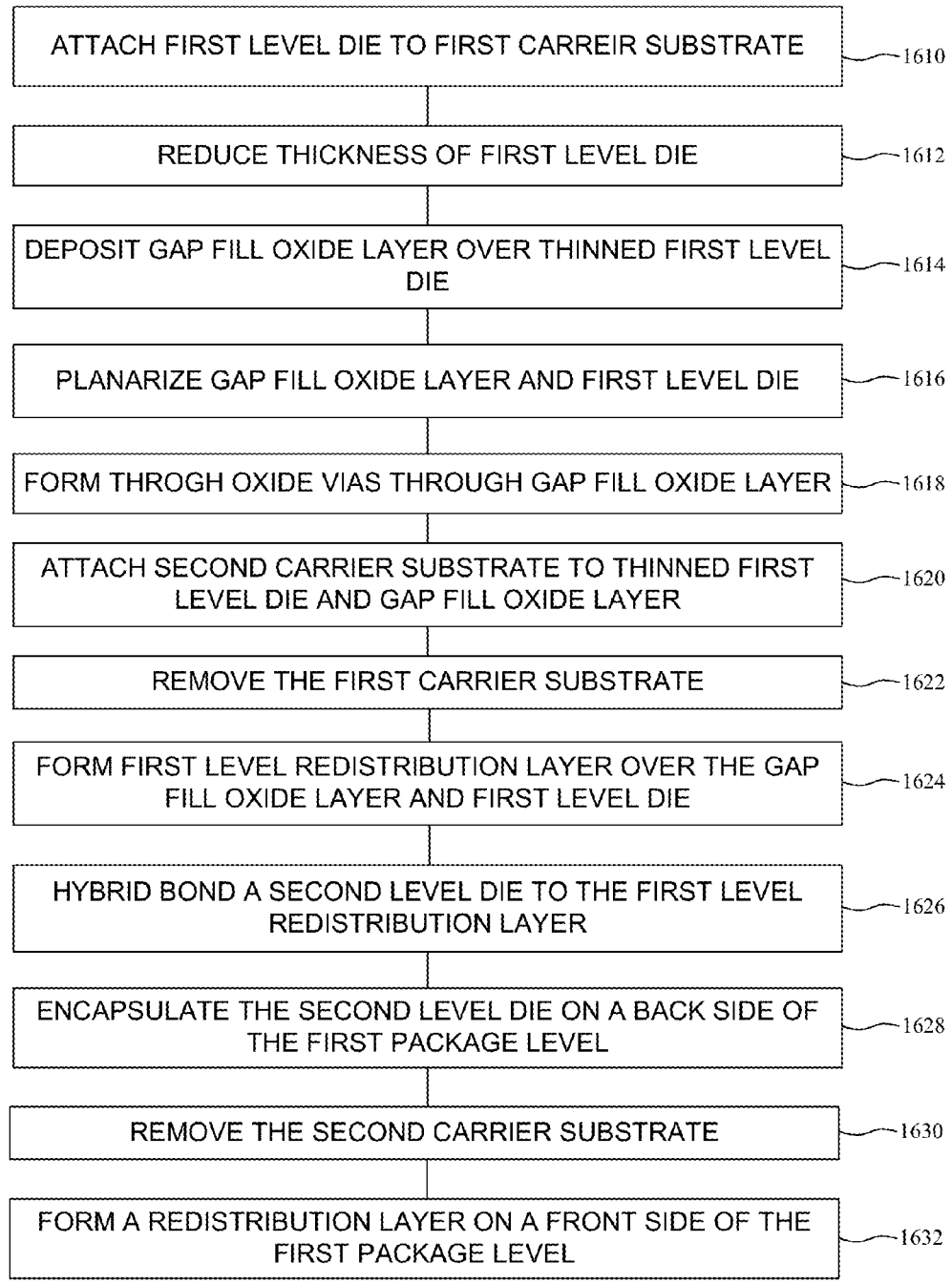
FIG. 16 is a flow chart illustrating a method of forming a package in accordance with an embodiment.
Figure 17A:
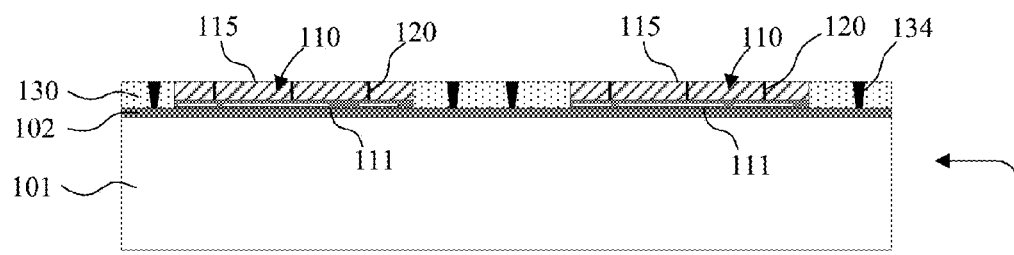
FIGS. 17A-17D are cross-sectional side view illustrations of a method of forming a package in accordance with an embodiment.
Figure 17B:
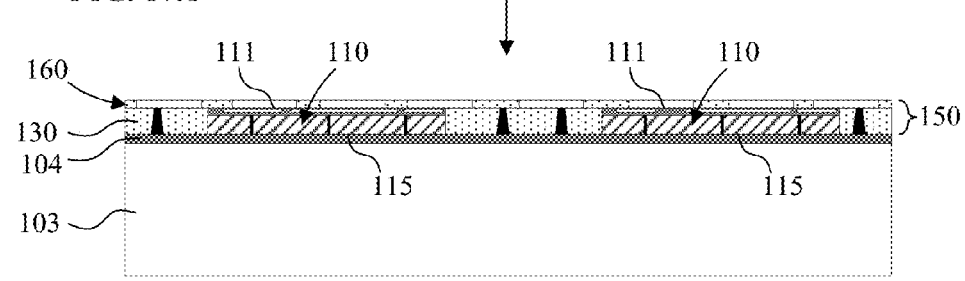

FIG. 16 is a flow chart illustrating a method of forming a package in accordance with an embodiment. In the following description of FIG. 16 reference is made with regard to the features found in the cross-sectional side view illustrations provided in FIGS. 3-12 and FIGS. 17A-17E. Referring to FIG. 16, at operation a 1610 a first level die 110 is attached to a first carrier substrate 101 similarly as previously described with regard to FIG. 3. At operation 1612 a thickness of the first level die 110 is reduced, similarly as described with regard to FIG. 4. At operation 1614, a gap fill oxide layer 130 is deposited over the thinned first level die 110, similarly as described with regard to FIG. 5. At operation 1618, TOVs 134 are formed through the gap fill oxide layer 130, similarly as described with regard to FIG. 6, resulting in the structure illustrated in FIG. 17A.

At operation 1620 a second carrier substrate 103 is attached to the thinned first level die 110 and gap fill oxide layer 130. The first carrier substrate 101 may then be removed at operation 1622, and a first level RDL 160 is formed over the gap fill oxide layer 130 and first level die 110 at operation 1624, resulting in the structure illustrated in FIG. 17B. At this stage, the front side 111 of the first level die 110 is facing up toward the first level RDL 160 in the first package level 150.

Figure 17C:
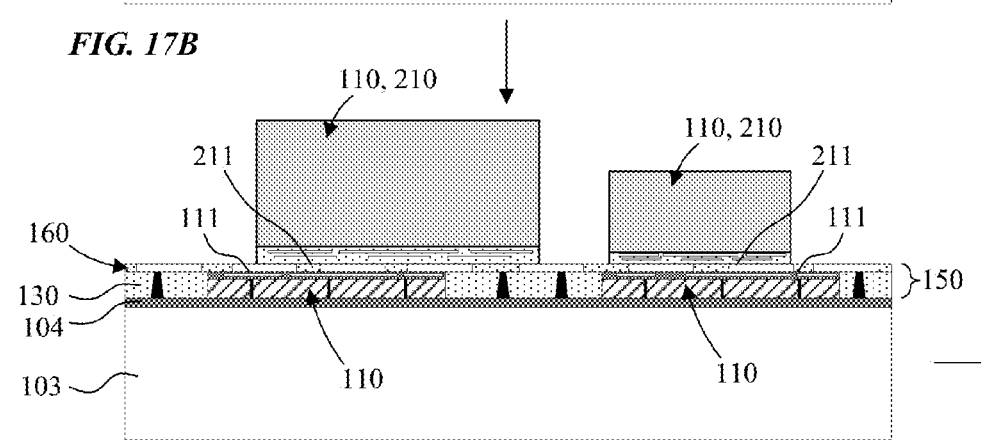
Figure 17D:
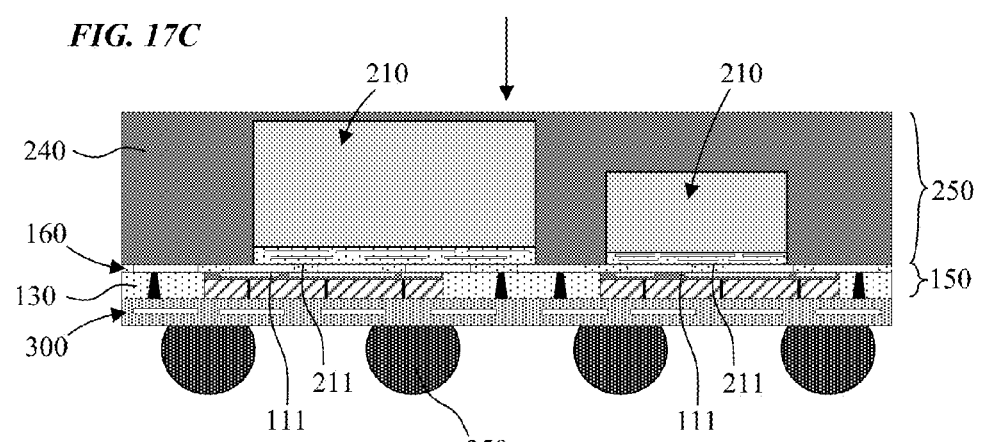
Figure 17E:
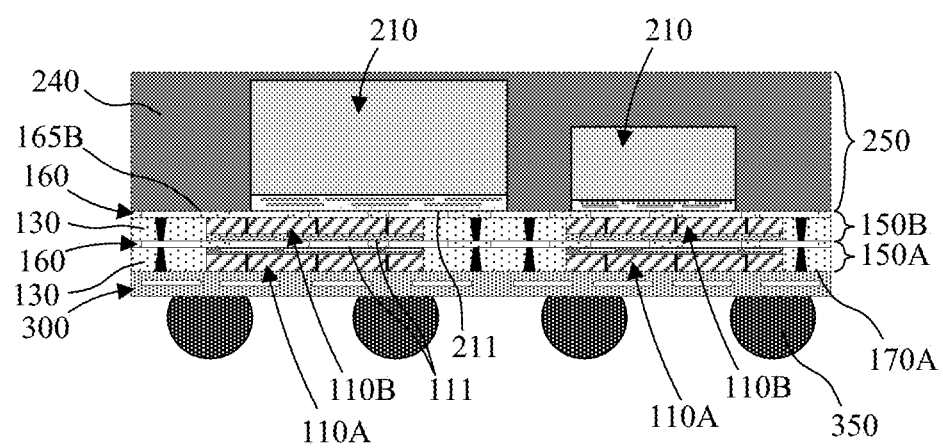
FIG. 17E is a cross-sectional side view illustration of a package with more than two package levels in accordance with an embodiment.

At operation 1626, a second level die 210 is hybrid bonded to the first level RDL 160, similarly as described with regard to FIG. 9, resulting in the structure illustrated in FIG. 17C. At this stage, operations 1412-1422 or 1612-1626 may be repeated one or more times to form additional package levels 150A, 150B, etc. At operation 1628, the second level die 210 is encapsulated on a back side of the first package level, similarly as described with regard to FIG. 10. At operation 1630, the second carrier substrate 103 is removed, and at operation 1632 an RDL is formed on a front side of the first package level, similarly as described with regard to FIG. 11. A thickness of the second package level 250 may then be reduced similarly as described with regard to FIG. 12. Referring to FIG. 17D a process flow is illustrated in which one first package level 150 is formed, with the front side 111 of the first level die 110 and front side 211 of the second level die 210 facing toward one another. Referring to FIG. 17E a process flow is illustrated in which two first package levels 150A, 150B are formed, the second level die 210 is encapsulated on a back side 165B of the first package level 150B, and the RDL 300 is formed on the front side 170A of the first package level 150A. In the embodiment illustrated in FIG. 17E, front side 111 of the first level die 110A within the first package level 150A, and front side 111 of the first level die 110B within the first package level 150B are facing toward one another. Alternatively, the orientation of either of the first level die 110A or 110B may be reversed.

Figure 18:
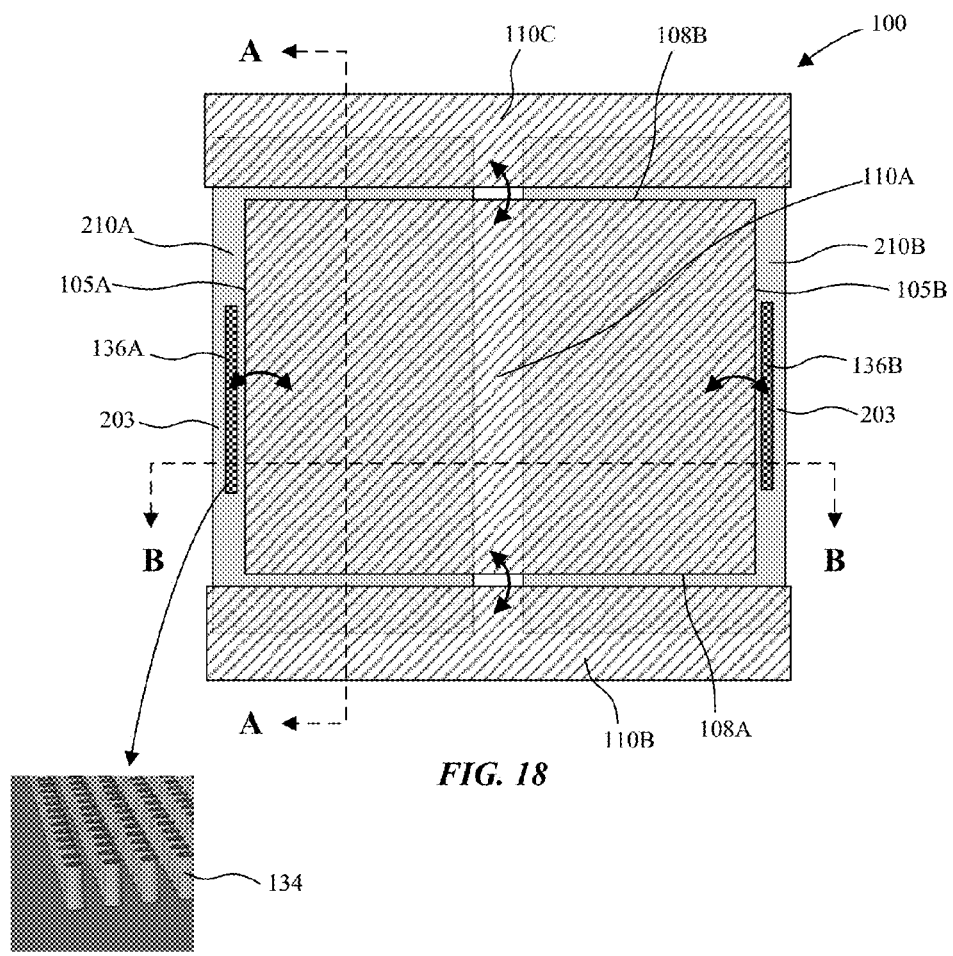
FIG. 18 a schematic bottom view illustration of a die stack arrangement and a close-up perspective view of a row of through oxide vias in accordance with an embodiment.
Figure 19A:
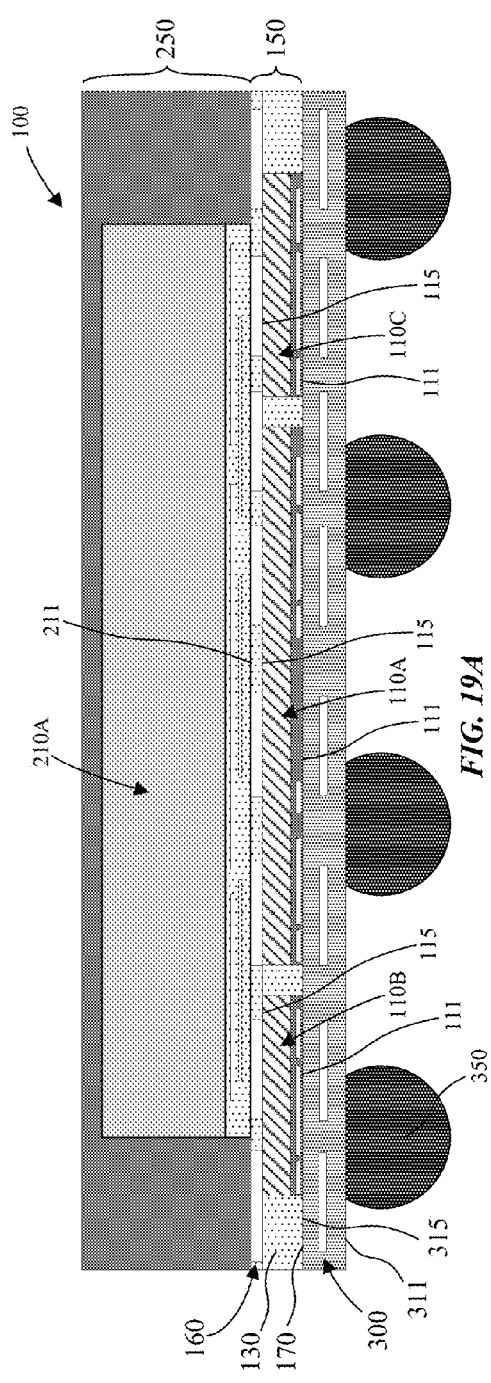
FIG. 19A is a cross-sectional side view illustration of a package taken along line A-A in FIG. 18 in accordance with an embodiment.
Figure 19B:
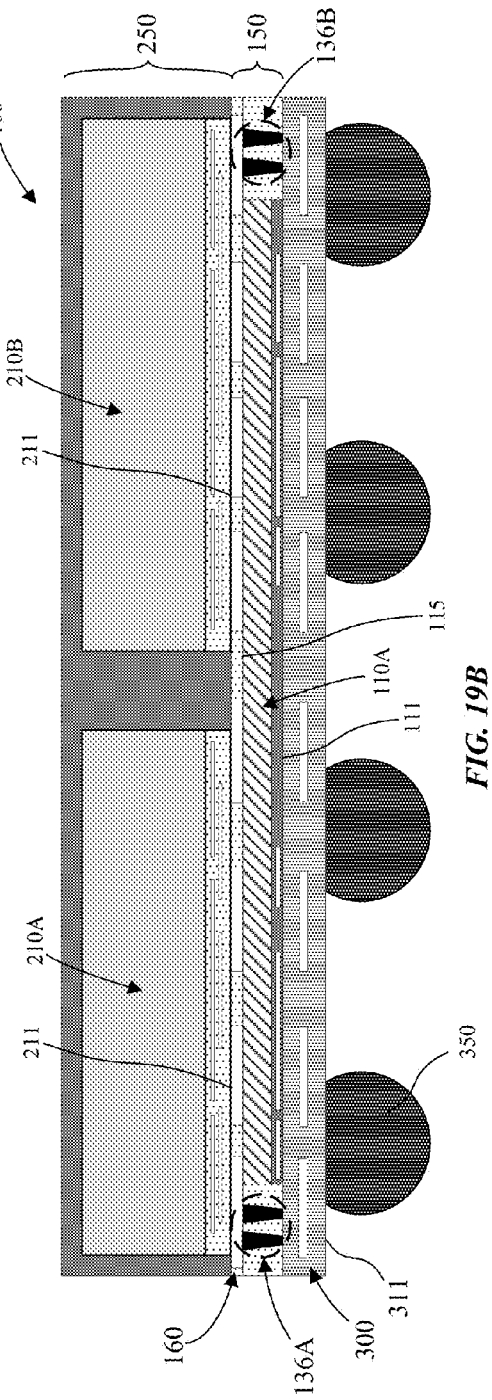
FIG. 19B is a cross-sectional side view illustration of a package taken along line B-B in FIG. 18 in accordance with an embodiment.

Referring now to FIG. 18 a schematic bottom view illustration of a die stack arrangement and close-up perspective view of a row of TOVs are provided in accordance with an embodiment. FIG. 19A is a cross-sectional side view illustration of a package taken along line A-A in FIG. 18 in accordance with an embodiment. FIG. 19B is a cross-sectional side view illustration of a package taken along line B-B in FIG. 18 in accordance with an embodiment. In the embodiments illustrated, a package 100 includes a first level die 110A, a second-first level die 110B, and a third-first level die 110C, a first row 136A of TOVs 134, and a second row 136B of TOVs 134. The second-first level die 110B and the third-first level die 110C are laterally adjacent to opposite sides of the first level die 110A. Referring to FIG. 18, the first level die 110A is rectangular, though other shapes are possible in accordance with embodiments. As shown, the first and second rows 136A, 136B of TOVs 134 are laterally adjacent (and parallel) to a first pair of laterally opposite sides 105A, 105B of the first level die 110A. As shown, the second-first level die 110B and the third-first level die 110C are laterally adjacent (and parallel to) to a second pair of laterally opposite sides 108A, 108B of the first level active die 110A, respectively.

Referring to FIG. 18 and FIGS. 19A-19B, a first-second level die 210A and a second-second level die 210B are arranged side-by-side over the first level die. The first row 136A of TOVs 134 is located beneath the first-second level die 210A, and the second row 136B of TOVs 134 is located beneath the second-second level die 210B. The rows 136A, 136B of TOVs 134 may be parallel to the adjacent edges 203 of the corresponding second level die 210A, 210B. In an embodiment, a back side 115 of the first level (e.g. active) die 210A is facing the front sides 111 of the first-second level die 210A and the second-second level die 210B laterally between the first and second rows 136A, 136B of TOVs 134. In such a configuration, short electrical routing paths (illustrated by arrows in FIG. 18) to each different edge of the first level active die 110A can be achieved. For example, an RDL 300 (see FIGS. 19A-19B, for example) may be formed on and in electrical contact with the first level active die 110A, the first and second rows 136A, 136B of TOVs 134, and the second-first level die 110B and the third-first level die 110C.

In an embodiment, a package 100 includes an RDL 300, and a front side 170 of a first package level 150 on a back side 315 of the RDL 300. A first level die 110A is encapsulated in a gap fill oxide layer 130 on the back side 315 of the RDL 300. Additionally, a second-first level die 110B and a third-first level die 110C may be located laterally adjacent to opposite sides of the first level die 110A. The first level die 110A, 110B, 110C may all be on an in electrical contact with the RDL 300. A first row 136A of TOVs 134 and a second row 136B of TOVs 134 protrude from the back side 315 of the RDL 300, and the first level die 110A is located laterally between the first and second rows 136A, 136B of TOVs 134. In an embodiment, the RDL 300 may be formed on an in electrical contact with front sides 111 of the first level die 110A, 110B, 110C and the first and second rows 136A, 136B of TOVs. A plurality of second level die 210A, 210B are hybrid bonded to a back side 165 of the first package level 150 with direct bonded oxide-oxide surfaces and direct bonded metal-metal surfaces. The first package level 150 may additionally include a first package level RDL 160 on a back side 115 of the first level die 110A and the gap fill oxide layer 130.

It is to be appreciated, that the particular arrangement of a pair of second level die 210A, 210B, and a pair of second-first level die 110B and third-first level die 110C are exemplary. While the particular arrangement may be used to form short electrical routing paths to each side of the first level die 110A, other configurations are possible. Additionally, the first level die 110A, second-first level die 110B, and/or third-first level die 110C may include TSVs 120 as previously described.

While several package variations are described and illustrated separately, many of the structural features and processing sequences may be combined in a single embodiment. In utilizing the various aspects of the embodiments, it would become apparent to one skilled in the art that combinations or variations of the above embodiments are possible for forming package including heterogeneous stacked die. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A package comprising:
a redistribution layer (RDL);
a front side of a first package level on the RDL, the first package level including:
a first level die encapsulated in a gap fill oxide layer on the RDL, wherein laterally opposite sides of the first level die are laterally surrounded by the gap fill oxide; and a plurality of through oxide vias (TOVs) that are laterally adjacent to the laterally opposite sides of first level die and extend through the gap fill oxide layer;

wherein the TOVs and the first level die have a height of about 20 microns or less; and a second package level including a second level die hybrid bonded to a back side of the first package level, the hybrid bond including directed bonded oxide-oxide surfaces and direct bonded metal-metal surfaces.

2. The package of claim 1, wherein the first package level includes a first package level RDL on a back side of the first level die and the gap fill oxide layer, and the plurality of TOVs provide an electrical connection between the RDL and the first package level RDL.

3. The package of claim 2, wherein the second level die is hybrid bonded to a planarized back surface of the first package level RDL.

4. The package of claim 3, wherein the first package level RDL includes an oxide dielectric layer and metal redistribution line, and the second level die is hybrid bonded to the oxide dielectric layer and the metal redistribution line.

5. The package of claim 2, wherein the first level die includes a plurality of through silicon vias (TSVs) and the first package level RDL is formed on and in electrical contact with the plurality of TSVs.

6. The package of claim 1, wherein the RDL is formed on and in electrical contact with a front side of the first level die and the plurality of TOVs.

7. A package comprising:
a redistribution layer (RDL);
a front side of a first package level on the RDL, the first package level including:
 a first level die encapsulated in a gap fill oxide layer on the RDL; and
 a plurality of through oxide vias (TOVs) extending through the gap fill oxide layer;
 wherein the TOVs and the first level die have a height of about 20 microns or less; and
a second package level including a second level die hybrid bonded to a back side of the first package level, the hybrid bond including directed bonded oxide-oxide surfaces and direct bonded metal-metal surfaces, wherein the second level die is encapsulated in a molding compound on the first package level.

8. The package of claim 7, further comprising:
a second row of TOVs;
wherein the plurality of TOVs comprises a first row of TOVs, and the first and second rows of TOVs are laterally adjacent to a first pair of laterally opposite sides of the first level die;
a second-first level die and a third-first level die laterally adjacent to a second pair of laterally opposite sides of the first level die;
wherein the RDL is formed on and in electrical contact with a front side of the first level die, a front side of the second-first level die, a front side of the third-first level die, the first row of TOVs, and the second row of TOVs.

9. The package of claim 8, further comprising a plurality of TSVs within the first level die, wherein each TSV has a maximum width of about 10 µm or less.

10. A package comprising:
a redistribution layer (RDL);
a front side of a first package level on a back side of the RDL, the first package level including:
 a first level die encapsulated in a gap fill oxide layer on the back side of the RDL;
 a first row of through oxide vias (TOVs) protruding from the back side of the RDL;
 a second row of through oxide vias (TOVs) protruding from the back side of the RDL;
 wherein the first level die is located laterally between the first and second rows of TOVs; and
a plurality of second level die hybrid bonded to a back side of the first package level, the hybrid bond including directed bonded oxide-oxide surfaces and direct bonded metal-metal surfaces.

11. The package of claim 10, wherein the first package level includes a first package level RDL on a back side of the first level die and the gap fill oxide layer, and the plurality of TOVs provide an electrical connection between the RDL and the first package level RDL.

12. The package of claim 11, wherein the first package level RDL includes an oxide dielectric layer and a metal redistribution line, and the second level die is hybrid bonded to the oxide dielectric layer and the metal redistribution line.

13. The package of claim 10, further comprising a second-first level die and a third-first level die laterally adjacent to opposite sides of the first level die, wherein the first level die, the second-first level die, and the third-first level die are on and in electric contact with the RDL.

14. The package of claim 13, wherein the first level die is rectangular, the first and second rows of TOVs are laterally adjacent to a first pair of laterally opposite sides of the first level die, and the second-first level die and the third-first level die are laterally adjacent to a second pair of laterally opposite sides of the first level die.

15. The package of claim 14, wherein the first level die, the first row of TOVs, and the second row of TOVs have a height of about 20 µm or less.

16. The package of claim 15, further comprising a plurality of TSVs within the first level die, wherein each TSV has a maximum width of about 10 µm or less.

17. A method of forming a package comprising:
forming a first package level on a carrier substrate, the first package level including a first level die encapsulated in a gap fill oxide layer, and a plurality of though oxide vias (TOVs), wherein the TOVs have a height of about 20 µm or less, wherein the method of forming the first package level on the carrier substrate comprises:
 attaching the first level die to the carrier substrate;
 depositing the gap fill oxide layer over the first level die;
 planarizing the gap fill oxide layer; and
 forming the plurality of TOVs in the gap fill oxide layer;
hybrid bonding a second level die to the first package level, wherein the hybrid bond includes direct bonded oxide-oxide surfaces and metal-metal surfaces;
encapsulating the second level die on a back side of the first package level;
removing the carrier substrate; and
forming a redistribution layer (RDL) on a front side of the first package level.

18. The method of claim 17, further comprising grinding the first level die to reduce a thickness of the first level die after attaching the first level die to the carrier substrate and prior to depositing the gap fill oxide layer over the first level die.

19. The method of claim 17:
wherein forming the first package level on the carrier substrate comprises:
 forming a first level RDL on the planarized gap fill oxide layer and first level die; and planarizing the first level RDL; and
wherein hybrid bonding the second level die to the first package level comprises:
hybrid bonding the second level die to the planarized first level RDL.

* * * * *

UNITED STATES PATENT AND TRADEMARK OFFICE
CERTIFICATE OF CORRECTION

PATENT NO. : 9,559,081 B1
APPLICATION NO. : 14/935310
DATED : January 31, 2017
INVENTOR(S) : Kwan-Yu Lai et al.

It is certified that error appears in the above-identified patent and that said Letters Patent is hereby corrected as shown below:

In the Claims

Column 13, Line 9, the text "directed" should read --direct--

Column 13, Line 42, the text "directed" should read --direct--

Column 14, Line 9, the text "directed" should read --direct--

Signed and Sealed this
Twenty-first Day of March, 2017

Michelle K. Lee
*Director of the United States Patent and Trademark Office*